United States Patent
Wada et al.

(10) Patent No.: US 7,154,360 B2
(45) Date of Patent: Dec. 26, 2006

(54) FILTER USING PIEZOELECTRIC MATERIAL

(75) Inventors: Koichi Wada, Yokohama (JP); Satoshi Ichikawa, Otawara (JP); Hirotada Wachi, Yokohama (JP); Tohru Takezaki, Yokohama (JP); Tsuyoshi Oura, Kawasaki (JP); Toshifumi Tanaka, Otawara (JP); Satoshi Orito, Yokohama (JP)

(73) Assignee: Fujitsu Media Devices Limited, Kanagawa (JP)

( * ) Notice: Subject to any disclaimer, the term of this patent is extended or adjusted under 35 U.S.C. 154(b) by 63 days.

(21) Appl. No.: 10/950,975

(22) Filed: Sep. 28, 2004

(65) Prior Publication Data

US 2005/0093660 A1    May 5, 2005

(30) Foreign Application Priority Data

Sep. 29, 2003 (JP) ............................. 2003-338854

(51) Int. Cl.
*H03H 9/00* (2006.01)
*H03H 9/13* (2006.01)
*H01L 41/047* (2006.01)

(52) U.S. Cl. ...................... 333/194; 333/195; 333/196; 310/313 C

(58) Field of Classification Search ................ 333/133, 333/193, 194, 195, 196; 310/313 B, 313 C, 310/313 D
See application file for complete search history.

(56) References Cited

U.S. PATENT DOCUMENTS 4,375,624 A * 3/1983 DeVries ...................... 333/194

FOREIGN PATENT DOCUMENTS

| JP | 6-232681 A | 8/1994 |
|----|------------|--------|
| JP | 10-41778 | 2/1998 |
| KR | 10-0168963 B1 | 10/1998 |

* cited by examiner

*Primary Examiner*—Dean Takaoka
(74) *Attorney, Agent, or Firm*—Arent Fox PLLC

(57) ABSTRACT

A filter includes a piezoelectric substrate, and interdigital transducers (IDTs) that are formed on the piezoelectric substrate. At least one of the IDTs has a main electrode finger pattern that is weighted. The IDT having the main electrode finger pattern also has a sub electrode finger pattern that is connected in parallel to the main electrode finger pattern, and generates a surface acoustic wave that cancels a surface acoustic wave caused by leakage electric fields generated in the main electrode finger pattern.

17 Claims, 18 Drawing Sheets

→ ELECTRIC FIELD COMPONENTS TAKEN INTO CONSIDERATION IN DESIGN STAGE (SAW EXCITATION ORIGIN)

--▶ ELECTRIC FIELD COMPONENTS NOT TAKEN INTO CONSIDERATION IN DESIGN STAGE (SAW EXCITATION ORIGIN)

FILTER USING PIEZOELECTRIC MATERIAL

BACKGROUND OF THE INVENTION

1. Field of the Invention

The present invention generally relates to a filter using a piezoelectric material, and more particularly, to a filter that includes interdigital transducers (IDTs) formed on a piezoelectric substrate.

2. Description of the Related Art

In recent years, filters that are formed with surface acoustic wave devices each having interdigital transducers on a piezoelectric substrate are used as bandpass filters for television systems with frequency ranges of 30 MHz to 400 MHz, and as RF filters for portable telephone devices with 800 MHz or 1–9 GHz frequency ranges. An IDT has a pair of comb-like electrodes. Each of the comb-like electrodes includes a bus bar and electrode fingers. One end of each of the electrode fingers is connected to the bus bar, and the other end of each of the electrode fingers is open. The pair of comb-like electrodes is arranged so that the electrode fingers of one of the comb-like electrodes become adjacent to, or overlap with, the electrode fingers of the other one of the comb-like electrodes at predetermined intervals. When an AC voltage is applied to the pair of comb-like electrodes, a surface acoustic wave is generated. The surface acoustic wave has frequency characteristics. Utilizing the frequency characteristics, a filter with desired frequency characteristics can be realized.

FIG. 1 illustrates a conventional filter utilizing surface acoustic waves. The same type of filter as the filter shown in FIG. 1 is disclosed in Japanese Patent Application Publication No. 10-41778. The filter shown in FIG. 1 includes a first IDT 10, a ground electrode 20, and a second IDT 30. The first IDT 10, the ground electrode 20, and the second IDT 30 are formed on a piezoelectric substrate, and are adjacent to one another in the surface acoustic wave propagation direction. The ground electrode 20 is interposed between the first IDT 10 and the second IDT 30, and functions as a shield electrode. The first IDT 10 serves as an input electrode (or an output electrode), while the second IDT 30 serves as an output electrode (or an input electrode). The ground electrode 20 prevents electromagnetic coupling between the IDT 10 and the IDT 30. Also, the ground electrode 20 is obliquely arranged so that surface acoustic waves generated from the IDT 10 (or the IDT 30) can be prevented from being reflected and returning to the IDT 10 (or the IDT 30).

The IDT 10 has a pair of comb-like electrodes 10a and 10b. The comb-like electrode 10a has a bus bar 12a and electrode fingers 14a. Likewise, the comb-like electrode 10b has a bus bar 12b and electrode fingers 14b. The open end of each of the electrode fingers 14a faces the open end of each corresponding one of the electrode fingers 14b. The overlapping parts of the neighboring electrode fingers 14a and 14b (the electrode finger overlapping parts), or the electrode finger parts facing each other, contribute to excitation of surface acoustic waves. In the structure shown in FIG. 1, the electrode finger pattern formed by the electrode fingers 14a and 14b is weighted. More specifically, the electrode finger pattern shown in FIG. 1 is weighted by apodization. In the apodized electrode finger pattern, the widths of the electrode finger overlapping parts (the widths will be hereinafter referred to as the aperture lengths) vary in the surface acoustic wave propagation direction. At either end part of the IDT 10, the aperture lengths are comparatively small. These parts are generally referred to as minute overlapping parts. The IDT 10 has greater aperture lengths in the center region. The aperture lengths are proportional to excitation intensity. Accordingly, surface acoustic wave has higher intensity in the center of the IDT 10 than the intensity at either end region of the IDT 10. The frequency characteristics can be varied by adjusting the apodization weighting.

The IDT 30 also includes a pair of comb-like electrodes, but these comb-like electrodes are not weighted. Accordingly, the aperture lengths in the IDT 30 are uniform. This type of IDT is called a normal IDT.

The filter with the above structure functions as a bandpass filter.

The filter shown in FIG. 1 and disclosed in Japanese Patent Application Publication No. 10-41778, however, cannot adequately attenuate the frequency components in the stop bands.

SUMMARY OF THE INVENTION

It is therefore an object of the present invention to provide a filter using a piezoelectric material in which the above disadvantage is eliminated.

A more specific object of the present invention is to provide a filter that exhibits improved stop-band characteristics.

The above objects of the present invention are achieved by a filter including: a piezoelectric substrate; and a plurality of interdigital transducers (IDTs) formed on the piezoelectric substrate, at least one of the IDTs having a main electrode finger pattern that is weighted, and the at least one of the IDTs also having a sub electrode finger pattern that is connected in parallel to the main electrode finger pattern, and generates a surface acoustic wave that cancels a surface acoustic wave caused by leakage electric fields generated in the main electrode finger pattern.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 1:
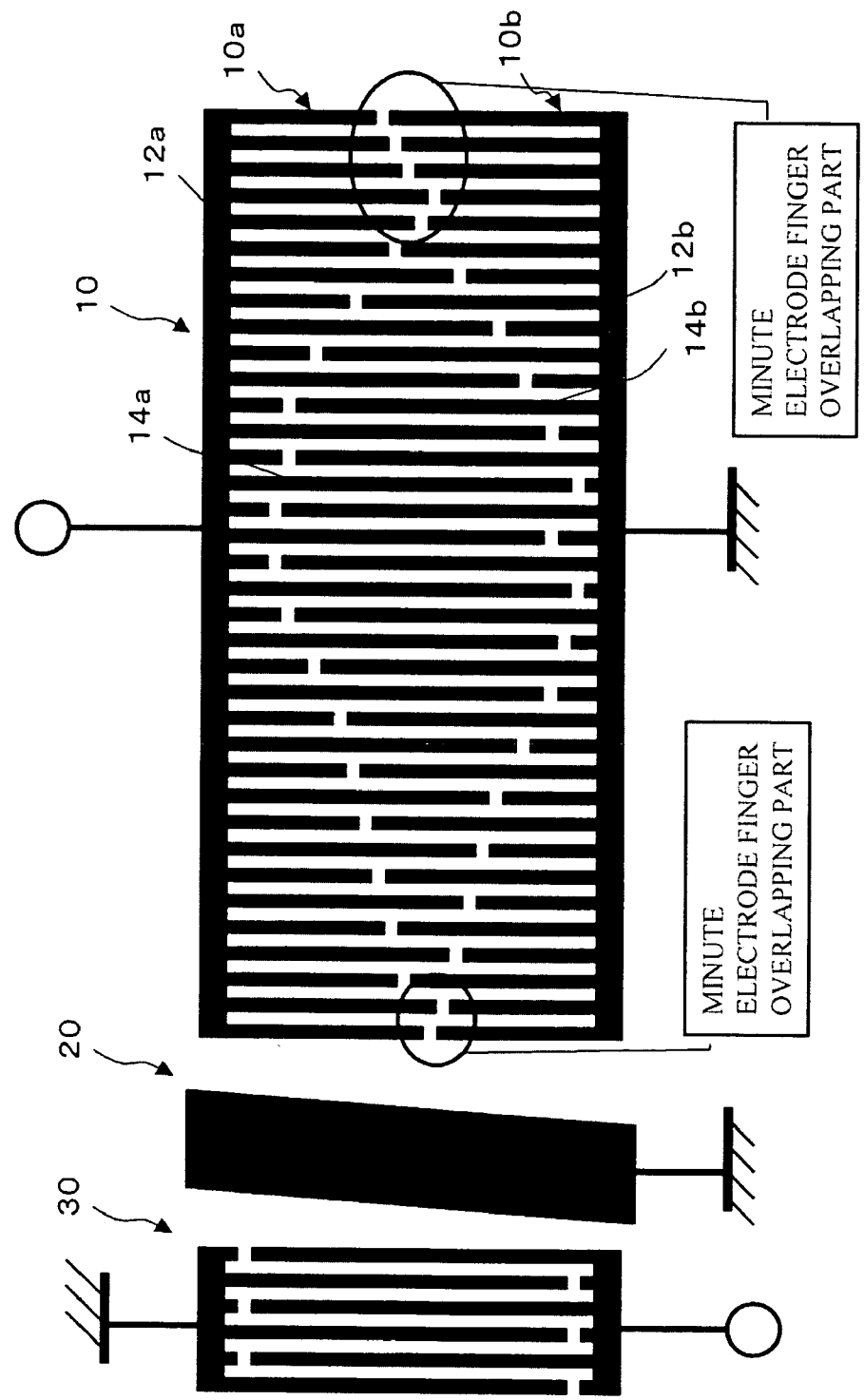
FIG. 1 illustrates a conventional filter.

The inventors studied the reason why the filter shown in FIG. 1 cannot adequately attenuate the frequency components in the stop bands and supposed the following.

Figure 2:
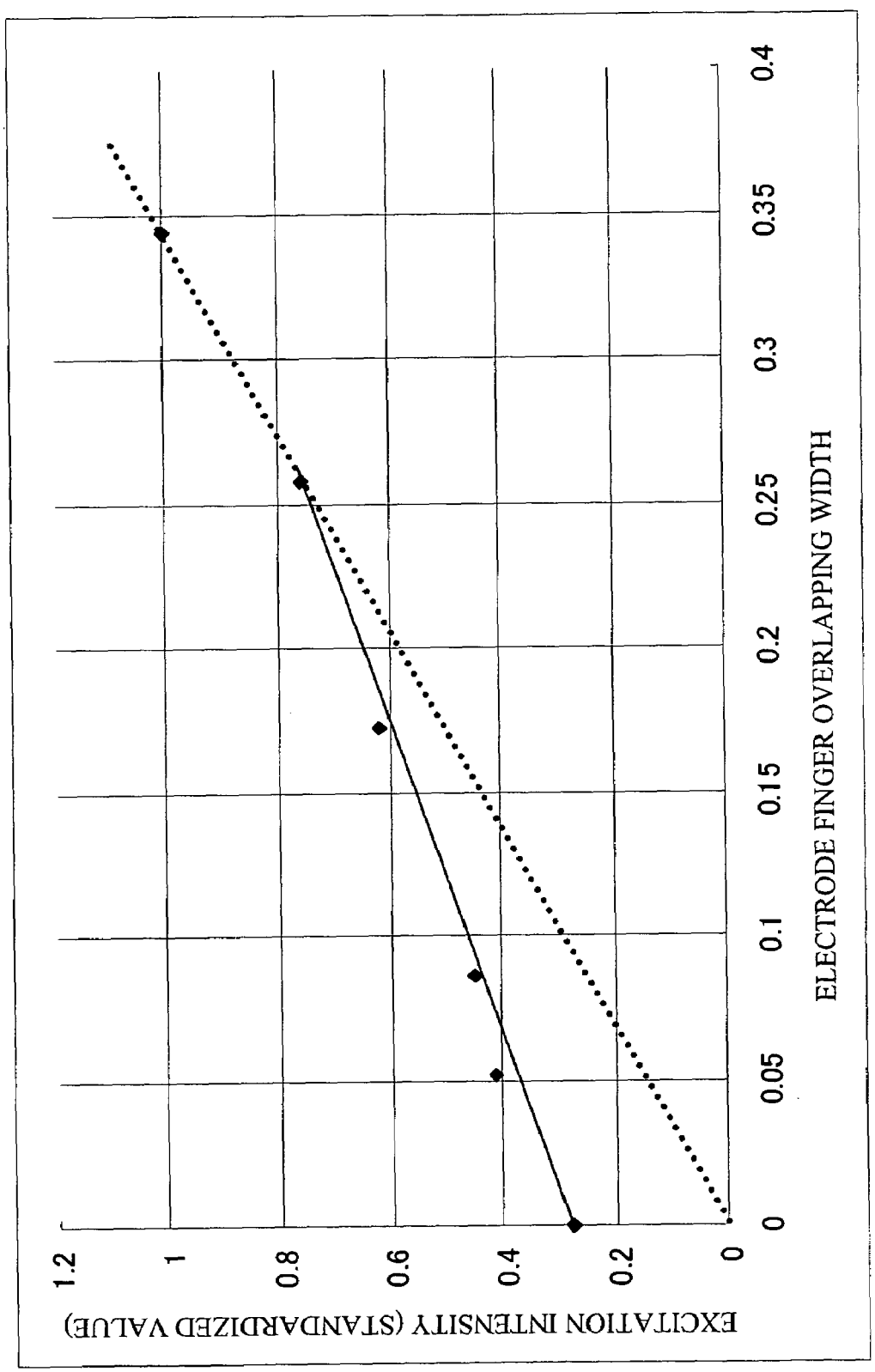
FIG. 2 is a graph representative of the relationship between aperture length and excitation intensity.

The inventors examined the relationship between aperture length and excitation intensity. FIG. 2 is a graph showing the examination result. In FIG. 2, the horizontal axis indicates aperture length ($\lambda$: $\lambda$ representing the wavelength of the surface acoustic wave in the pass band of the filter), and the vertical axis indicates normalized excitation intensity. Conventionally, it is considered that the electrode finger overlapping parts excite a surface acoustic wave and the aperture length is proportional to excitation intensity as indicated by the dotted line, while excitation does not occur when the aperture length is zero. In reality, the proportional relationship can be observed where the aperture length is $0.25\lambda$ or greater, but the excitation intensity varies as indicated by the solid line where the aperture length is $0.25\lambda$ or smaller, and excitation occurs even where the aperture length is zero, as shown in FIG. 2. In view of this, the inventors considered that there were other surface acoustic wave excitation sources than the electrode finger overlapping parts. More specifically, the inventors considered that surface acoustic waves were excited by leakage electric fields generated at the end portions of the electrode fingers.

Figure 3:
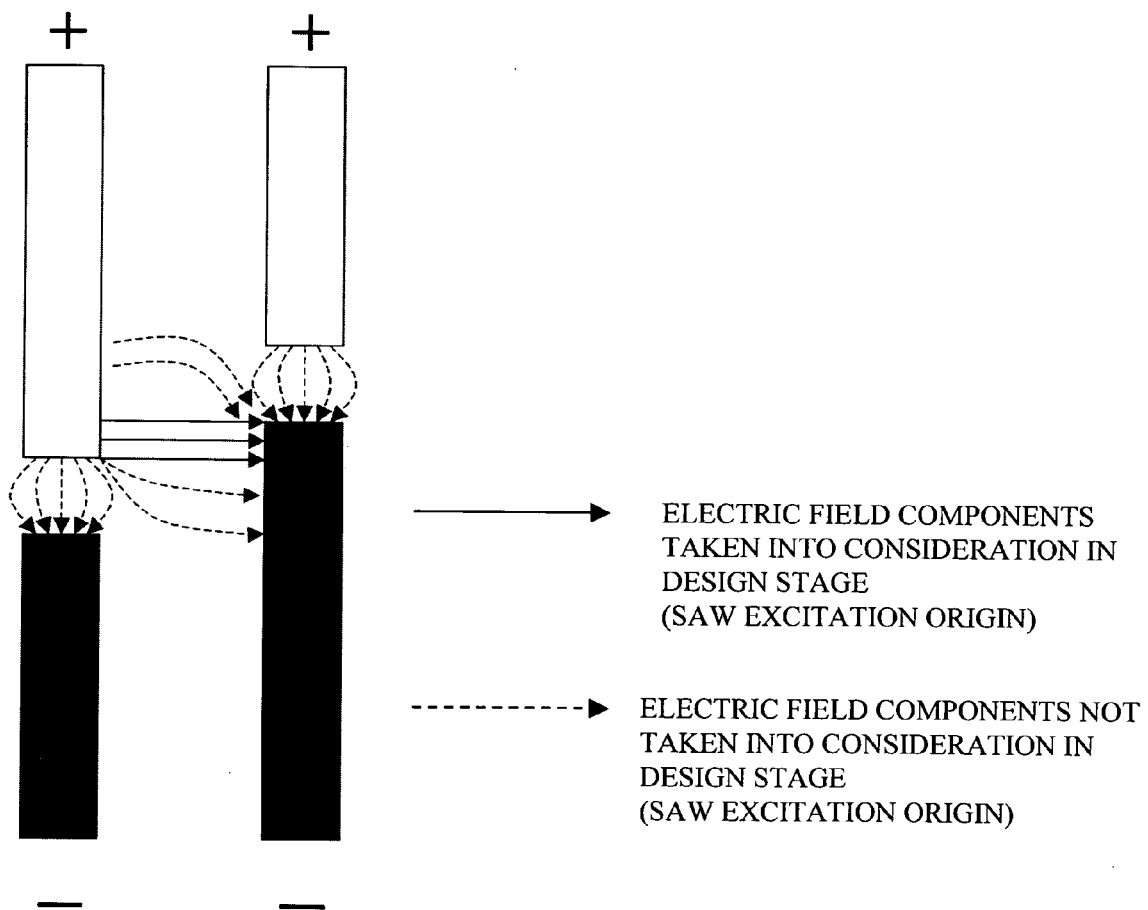
FIG. 3 illustrates the leakage electric fields generated in an IDT.

FIG. 3 illustrates electric fields generated at the end portions of electrode fingers. In FIG. 3, the solid lines indicate electric field components that are generated at the electrode finger overlapping parts and are taken into consideration in the design stage. The broken lines indicate leakage electric field components. The leakage electric field components are generated in the gap region between two electrode fingers that does not form a substantial electrode finger overlapping part. The leakage electric field components include electric field components that are generated from a positive-potential electrode finger to a negative-potential electrode finger facing the positive-potential electrode finger, and electric field components that are generated from a positive-potential electrode finger to a negative-potential electrode finger adjacent to the positive-potential electrode finger. Especially in a case where the electrode finger pattern is weighted as shown in FIG. 1, excitation caused by leakage electric fields cannot be ignored, because the stop-band characteristics deteriorate due to the excitation.

Figure 4:
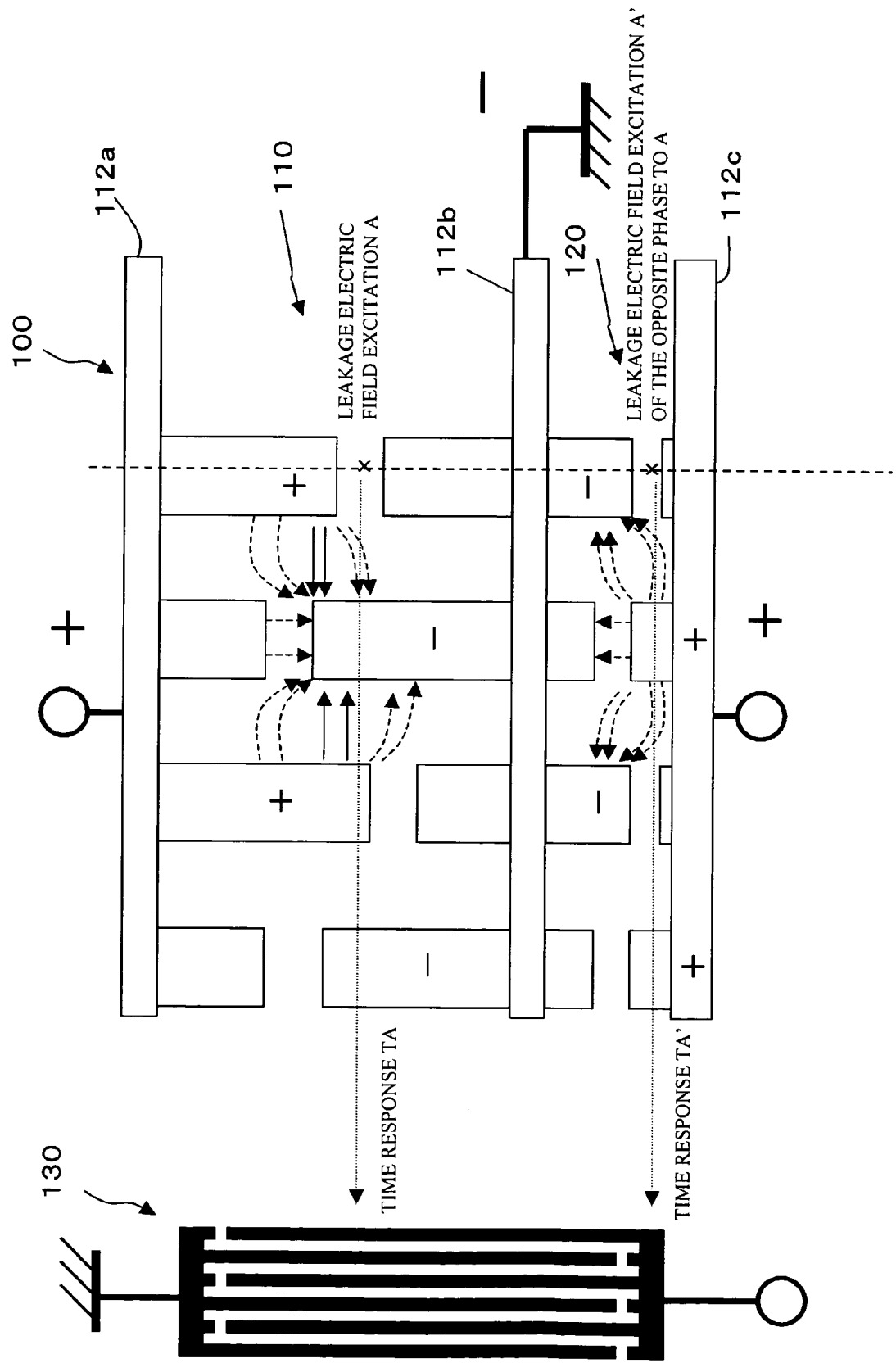
FIG. 4 illustrates the principles of the present invention.

Based on the above observation, the inventors developed a structure that generates a surface acoustic wave to cancel or eliminate the surface acoustic wave excited by the leakage electric fields generated in the IDT 10 shown in FIG. 1. FIG. 4 illustrates the principles of the invention. The filter shown in FIG. 4 includes an IDT 100 and an IDT 130 formed on a piezoelectric substrate. The ground electrode 20 shown in FIG. 1 is formed between the IDTs 100 and 130, but is not shown in FIG. 4, for simplification of the drawing. The IDT 100 includes a main electrode finger pattern 110 that is equivalent to the IDT 10 shown in FIG. 1, and a sub electrode finger pattern 120 that is newly introduced by the present invention. The sub electrode finger pattern 120 is electrically connected in parallel to the main electrode finger pattern 110, and generates the surface acoustic wave to cancel the leakage electric field wave generated in the main electrode finger pattern 110. The IDT 100 includes three bus bars 112a, 112b, and 112c. The bus bar 112b is shared between the main electrode finger pattern 110 and the sub electrode finger pattern 120. The structure shown in FIG. 4 may be considered to have an IDT that includes the main electrode finger pattern 110 and the bus bars 112a and 112b and another IDT that is connected to the IDT in parallel and includes the sub electrode finger pattern 120 and the bus bars 112b and 112c. The bus bar 112b is designed to have the ground potential that is the reference potential, and the same positive (or negative) AC voltage is applied to the bus bars 112a and 112c.

In the positions representing the same time-domain response, excitation A is caused by leakage electric fields generated in the main electrode finger pattern 110, and excitation A' is caused by leakage electric fields that are generated in the sub electrode finger pattern 120 and have the opposite phase to the leakage electric fields causing the excitation A. The positions representing the same time-domain response are located on a line that is perpendicular to the surface acoustic wave propagation direction. The excitation A caused by the leakage electric fields and the excitation A' caused by the leakage electric fields of the opposite phase to the leakage electric field causing the excitation A should preferably have the same intensity. More specifically, in the main electrode finger pattern 110, electrode finger overlapping parts are formed so as to obtain desired characteristics. Electric fields indicated by the solid-line arrows are generated by the potential difference among the electrode finger overlapping parts, and leakage electric fields indicated by the dotted-line arrows are generated in the gaps. In the sub electrode finger pattern 120, there are only minute electrode finger overlapping parts, as shown in FIG. 4. Accordingly, electric fields are not generated in the minute electrode finger overlapping parts, but leakage electric fields of the same intensity as the leakage electric fields generated in the main electrode finger pattern 110 are generated. As the electrode finger overlapping parts in the sub electrode finger pattern 120 are very small, the electrode fingers in the sub electrode finger pattern 120 are shorter than the electrode fingers in the main electrode finger pattern 110. In other words, the distance between the bus bar 112b and 112c is shorter than the distance between the bus bar 112a and 112b. As described later with reference to FIG. 6, the electrode fingers in the sub electrode finger pattern 120 may not even overlap with one another.

In the positions representing the same time-domain response, the electric fields caused by an excitation voltage in the main electrode finger pattern 110 have the opposite sign to the electric fields caused by the same excitation voltage in the sub electrode finger pattern 120. The sub electrode finger pattern 120 is excited in such a direction as to cancel the excitation in the main electrode finger pattern 110. Accordingly, the sub electrode finger pattern 120 has the opposite phase to the main electrode finger pattern 110. The wave excited by the leakage electric fields A in the main electrode finger pattern 110 is outputted in time TA, while the wave excited by the opposite-phase leakage electric fields A' in the sub electrode finger pattern 120 is outputted in time TA', which is the same as the time TA. Accordingly, the wave excited by the leakage electric fields A and the wave excited by the leakage electric fields A' cancel each other. On the other hand, the excitation caused in the electrode finger overlapping parts in the main electrode finger pattern 110 is not canceled, because the sub electrode finger pattern 120 does not have substantial electrode finger overlapping parts. Thus, the desired characteristics can be maintained.

The following is a description of embodiments of the present invention.

First Embodiment

Figure 5:
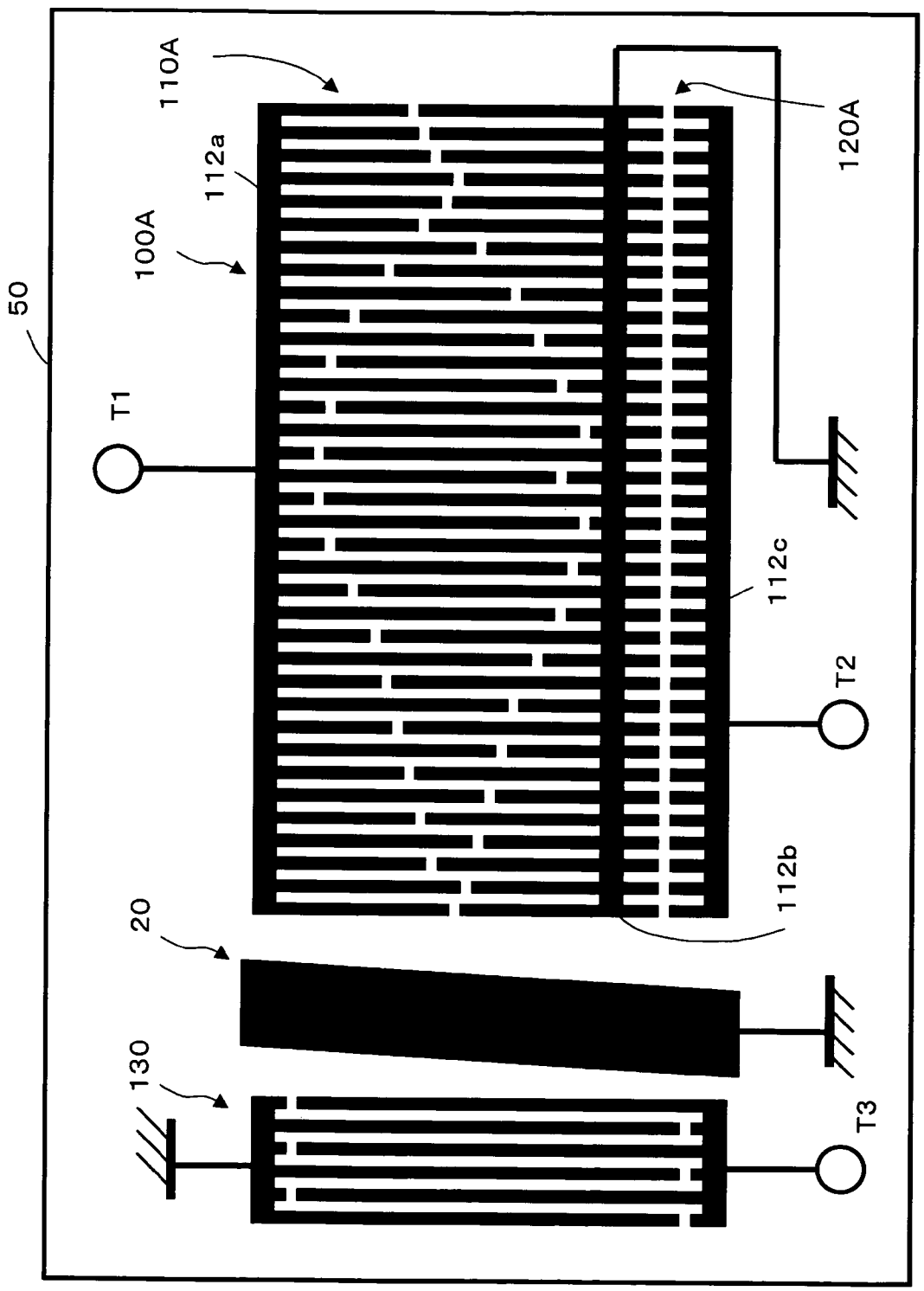
FIG. 5 illustrates a filter in accordance with a first embodiment of the present invention.

FIG. 5 illustrates the structure of a filter in accordance with a first embodiment of the present invention. The filter shown in FIG. 5 includes a piezoelectric substrate 50. This filter also includes an IDT 100A, a ground electrode 20, and an IDT 130, all of which are formed on the piezoelectric substrate 50. The IDT 100A functions as an input IDT, and the IDT 130 functions as an output IDT, for example. The IDT 130 may be used as an input IDT, while the IDT 100A is used as an output IDT. The ground electrode 20 has the same structure as the ground electrode 20 shown in FIG. 1. The IDT 130 also has the same structure as the IDT 30 shown in FIG. 1.

Figure 6:
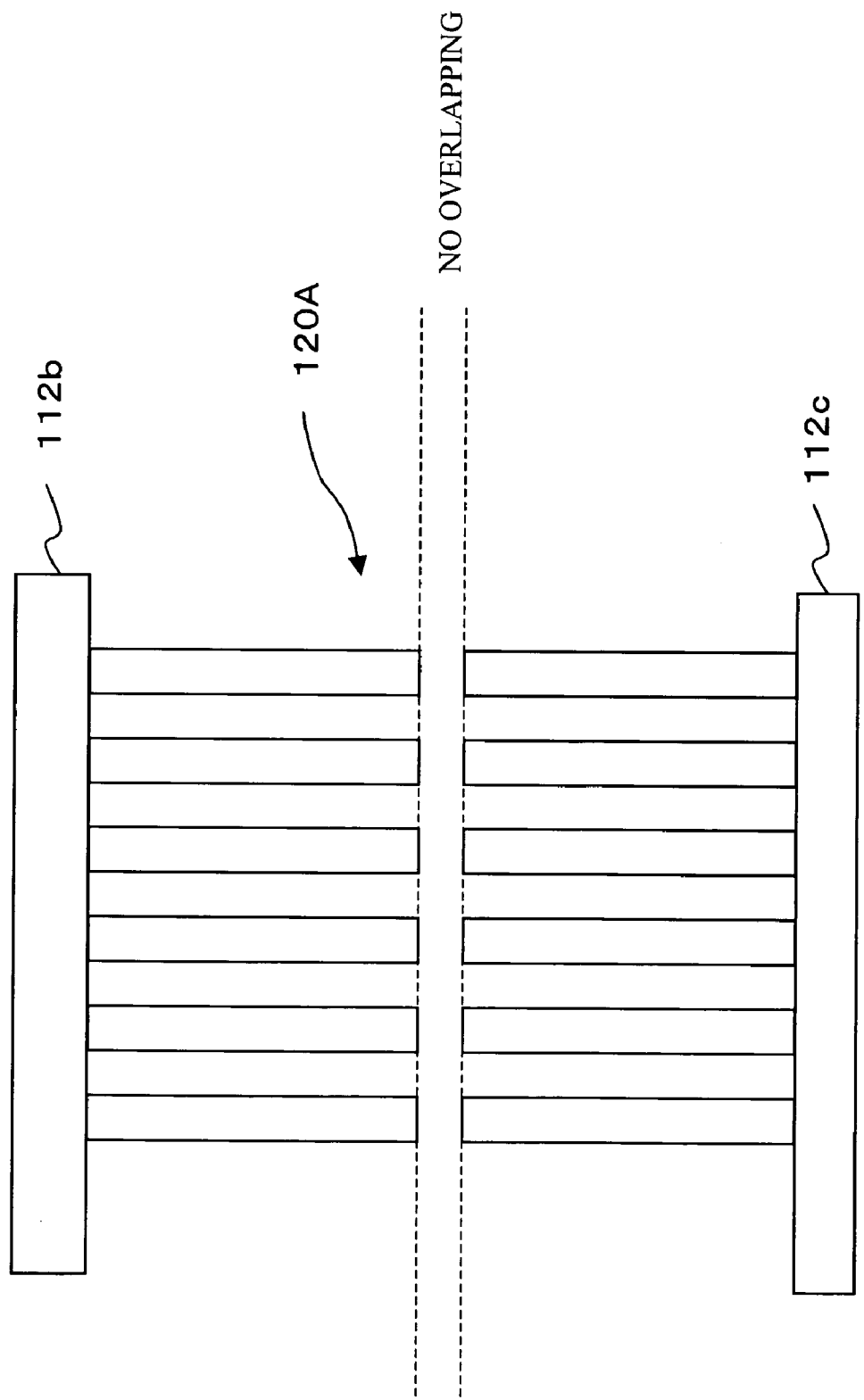
FIG. 6 illustrates an example of the sub electrode finger pattern.

The IDT 100A includes a main electrode finger pattern 110A and a sub electrode finger pattern 120A that are electrically connected in parallel. The main electrode finger pattern 110A has an apodized electrode finger pattern. The sub electrode finger pattern 120A is located on one side of the main electrode finger pattern 110A, and is arranged so as to correspond to the entire main electrode finger pattern 110A. The length of the main electrode finger pattern 110A in the surface acoustic wave propagation direction is substantially equal to the length of the sub electrode finger pattern 120A in the surface acoustic wave propagation direction. The aperture lengths in the sub electrode finger pattern 120A are all zero. FIG. 6 is a partially enlarged view of the sub electrode finger pattern 120A. The electrode fingers extending from the bus bar 112b and the electrode fingers extending from the bus bar 112c do not overlap, but face each corresponding other electrode finger, with uniform gaps being interposed. Since the sub electrode finger pattern 120A does not have electrode finger overlapping parts, electric fields due to electrode finger overlapping parts are not generated as in the main electrode finger pattern 110A. As the same AC voltage is applied to terminals T1 and T2 shown in FIG. 5, the leakage electric fields generated in the main electrode finger pattern 110A have the opposite phase to the leakage electric fields generated in the sub electrode finger pattern 120A. Accordingly, the leakage electric field wave generated in the main electrode finger pattern 110A is canceled by the leakage electric field wave generated in the sub electrode finger pattern 120A. As a result, the surface acoustic wave generated by the electric fields generated from the electrode finger overlapping parts in the main electrode finger pattern 110A can be transmitted to the IDT 130 via the ground electrode 20, not being affected by the sub electrode finger pattern 120A. Thus, the stop-band suppression can be increased.

In the structure shown in FIG. 5, the IDT 130 that is not apodized is designed in such a manner as to have an aperture length substantially equal to the total width (the total length in the direction perpendicular to the surface acoustic wave propagation direction) of the main electrode finger pattern 110A and the sub electrode finger pattern 120A.

The piezoelectric substrate 50 may be a Rayleigh wave filter made of 128° LiNbO$_3$, 112° LiTaO$_3$, Li$_2$B$_4$O$_7$, or quartz, or a surface acoustic wave filter that uses SH (Horizontal Shear) waves and is made of 36° LiTaO$_3$, 42° LiTaO$_3$, or 64° LiNbO$_3$.

Figure 7:
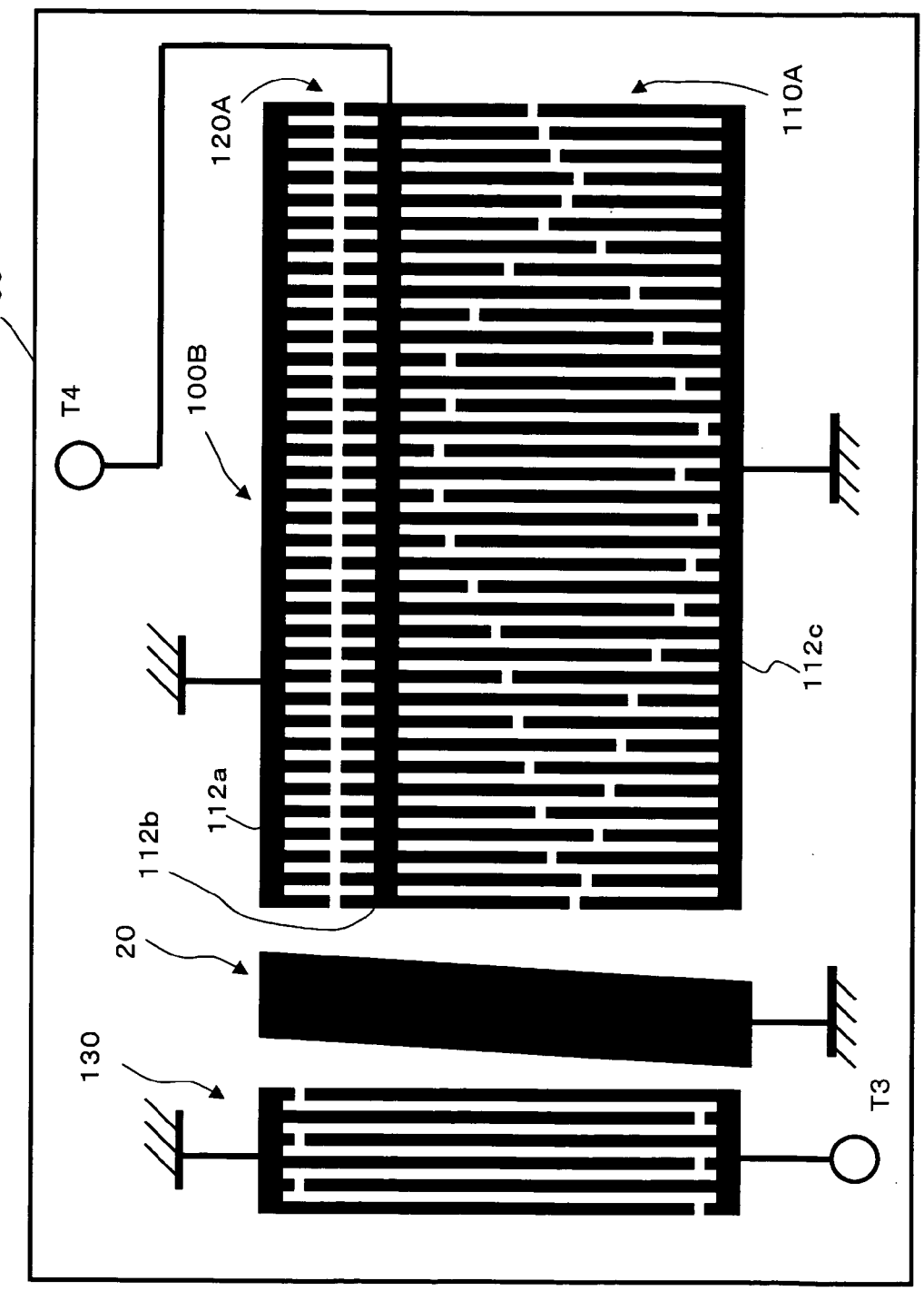
FIG. 7 illustrates a modification of the filter shown in FIG. 5.

FIG. 7 illustrates a modification of the filter shown in FIG. 5. An IDT 100B of this modification has a structure in which an AC voltage is applied to the bus bar 112b via a terminal T4, and the bus bars 112a and 112c are set to the ground potential. With this structure, the same functions and effects as the functions and effects shown in FIG. 4 can be achieved. The locations of the sub electrode finger pattern 120A and the main electrode finger pattern 110A are reversed, compared with the arrangement shown in FIG. 5. Still, the same effects can be achieved. In the electrode arrangement shown in FIG. 5, an AC voltage may be applied to the bus bar 112b, and the bus bar 112a and 112c may be set to the ground potential as shown in FIG. 7. The other aspects of the filter structure of this modification are the same as those of the filter structure shown in FIG. 5. With the structure shown in FIG. 7, the stop-band suppression can also be increased.

Second Embodiment

Figure 8:
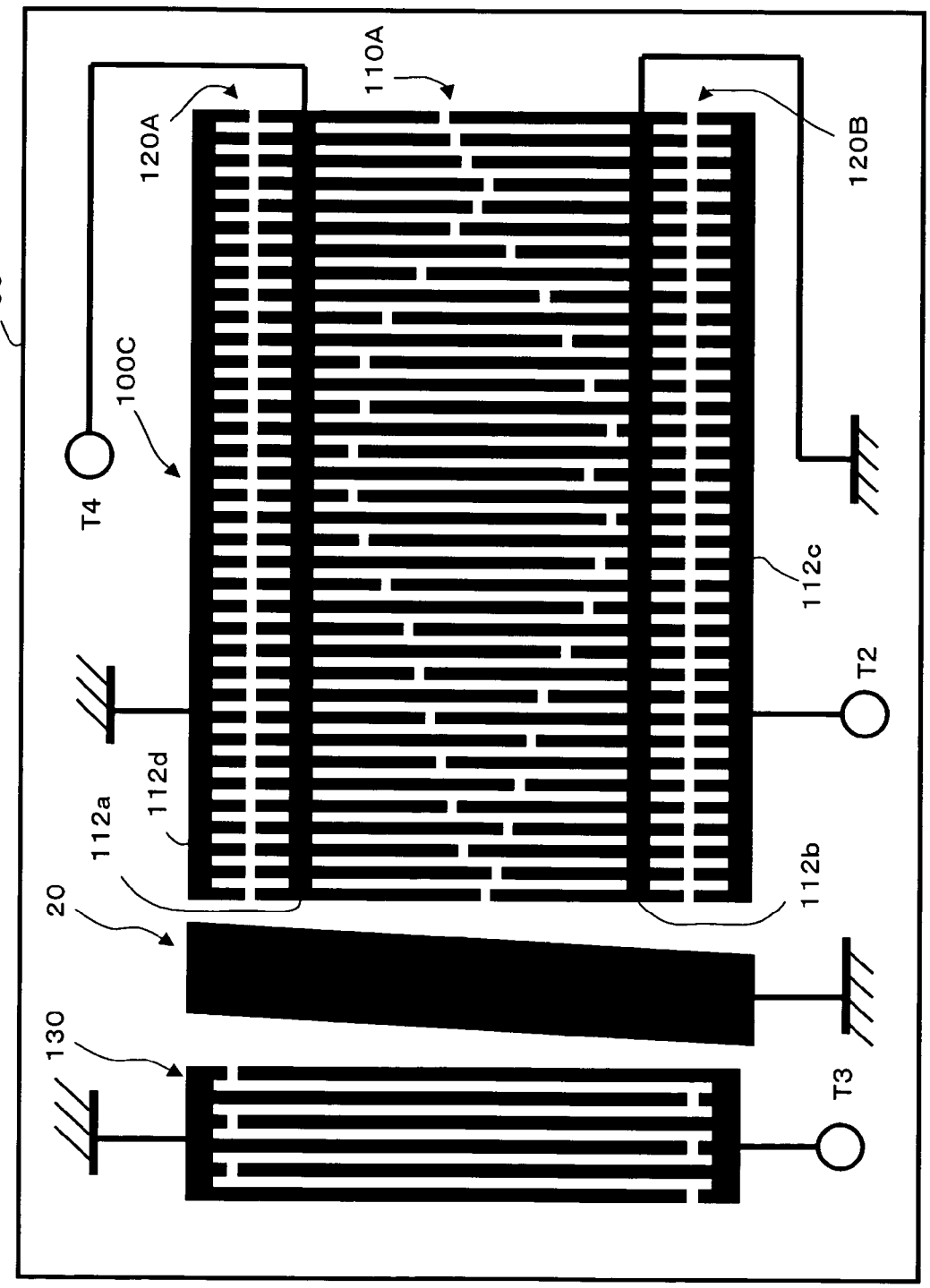
FIG. 8 illustrates a filter in accordance with a second embodiment of the present invention.

FIG. 8 illustrates a filter in accordance with a second embodiment of the present invention. In FIG. 8, the same components as those of the first embodiment are denoted by the same reference numerals as those of the first embodiment. An apodized IDT 100C of this filter includes two sub electrode finger patterns 120A and 120B. The sub electrode finger patterns 120A and 120B are located at both sides of the main electrode finger pattern 110A. The sub electrode finger patterns 120A and 120B are designed so as to correspond to the entire main electrode finger pattern 110A. Each of the sub electrode finger patterns 120A and 120B has the electrode finger pattern shown in FIG. 6. The main electrode finger pattern 110A and the sub electrode finger pattern 120B are electrically connected in parallel via the bus bar 112b. Likewise, the main electrode finger pattern 110A and the sub electrode finger pattern 120A are electrically connected in parallel via the bus bar 112a. The bus bar 112a is connected to the terminal T4, and the bus bar 112c of the sub electrode finger pattern 120B is connected to the terminal T2. A bus bar 112d of the sub electrode finger pattern 120A is grounded, and so is the bus bar 112b. As the same AC voltage is applied to the terminals T2 and T4, the sub electrode finger patterns 120A and 120B generate surface acoustic waves in such a direction as to cancel the leakage electric field waves generated in the main electrode finger pattern 110A. Since there are two sub electrode finger patterns, the electric field excitation caused in each of the sub electrode finger patterns 120A and 120B may be smaller than the excitation caused by the leakage electric fields generated in the main electrode finger pattern 110A.

With the above described structure, the stop-band suppression can be increased.

Third Embodiment

Figure 9:
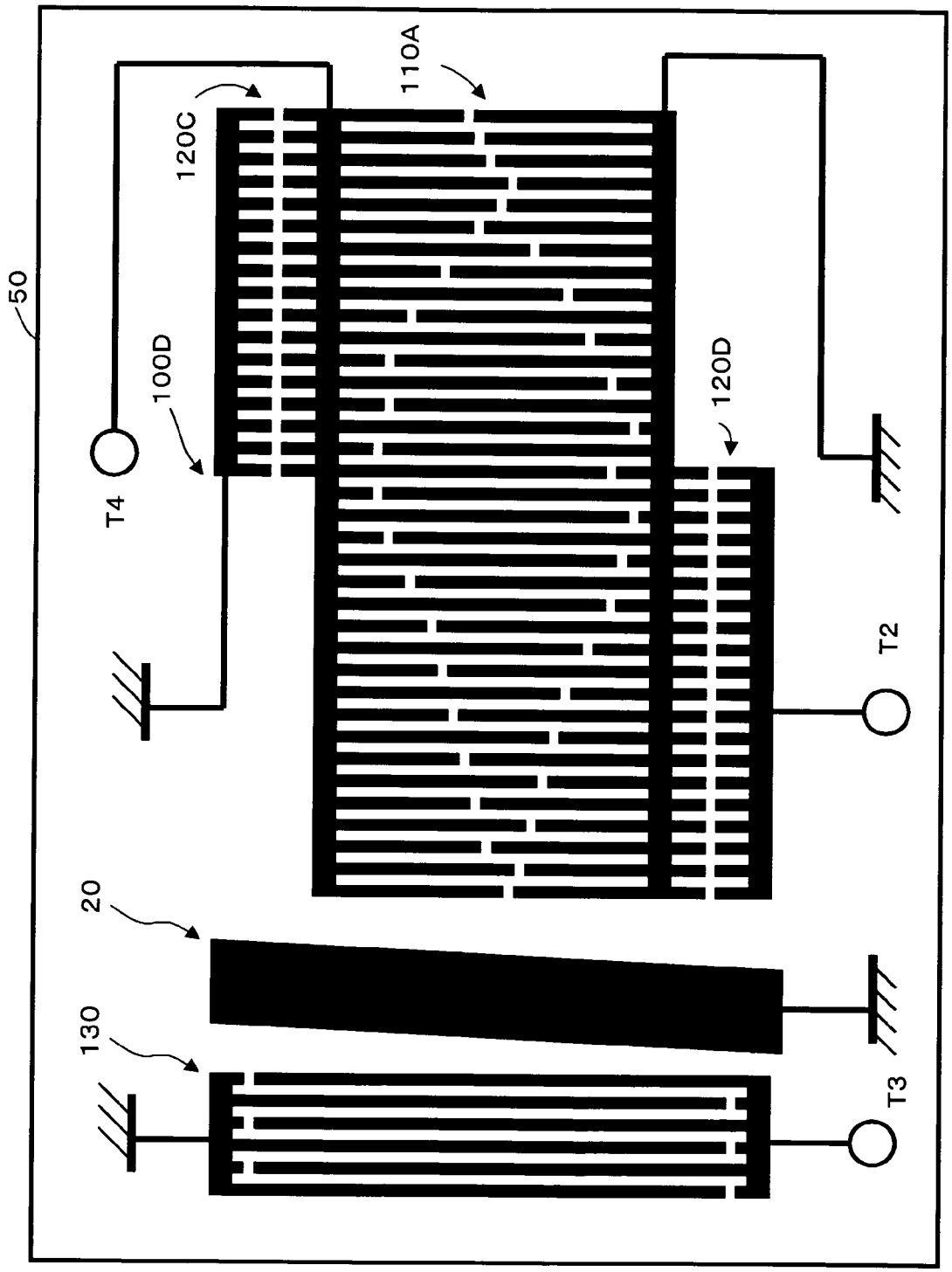
FIG. 9 illustrates a filter in accordance with a third embodiment of the present invention.

FIG. 9 illustrates a filter in accordance with a third embodiment of the present invention. In FIG. 9, the same components as those of the foregoing embodiments are denoted by the same reference numerals as those of the foregoing embodiments. The structure shown in FIG. 9 is a modification of the structure shown in FIG. 8. An apodized IDT 100D of this filter has sub electrode finger patterns 120C and 120D formed on both sides of the main electrode finger pattern 110A. Each of the sub electrode finger patterns 120C and 120D only partially corresponds to the main electrode finger pattern 110A, but the combination of the sub electrode finger patterns 120C and 120D covers the entire main electrode finger pattern 110A. In other words, the total length of the sub electrode finger patterns 120C and 120D in the surface acoustic wave propagation direction is equal to the length of the main electrode finger pattern 110A in the same direction. The sub electrode finger pattern 120C generates such a surface acoustic wave as to cancel out the leakage electric field wave generated in the right half of the main electrode finger pattern 110A. Likewise, the sub electrode finger pattern 120D generates such a surface acoustic wave as to cancel the leakage electric field wave generated in the left half of the main electrode finger pattern 110A.

With the above described structure, the stop-band suppression can also be increased.

Fourth Embodiment

Figure 10:
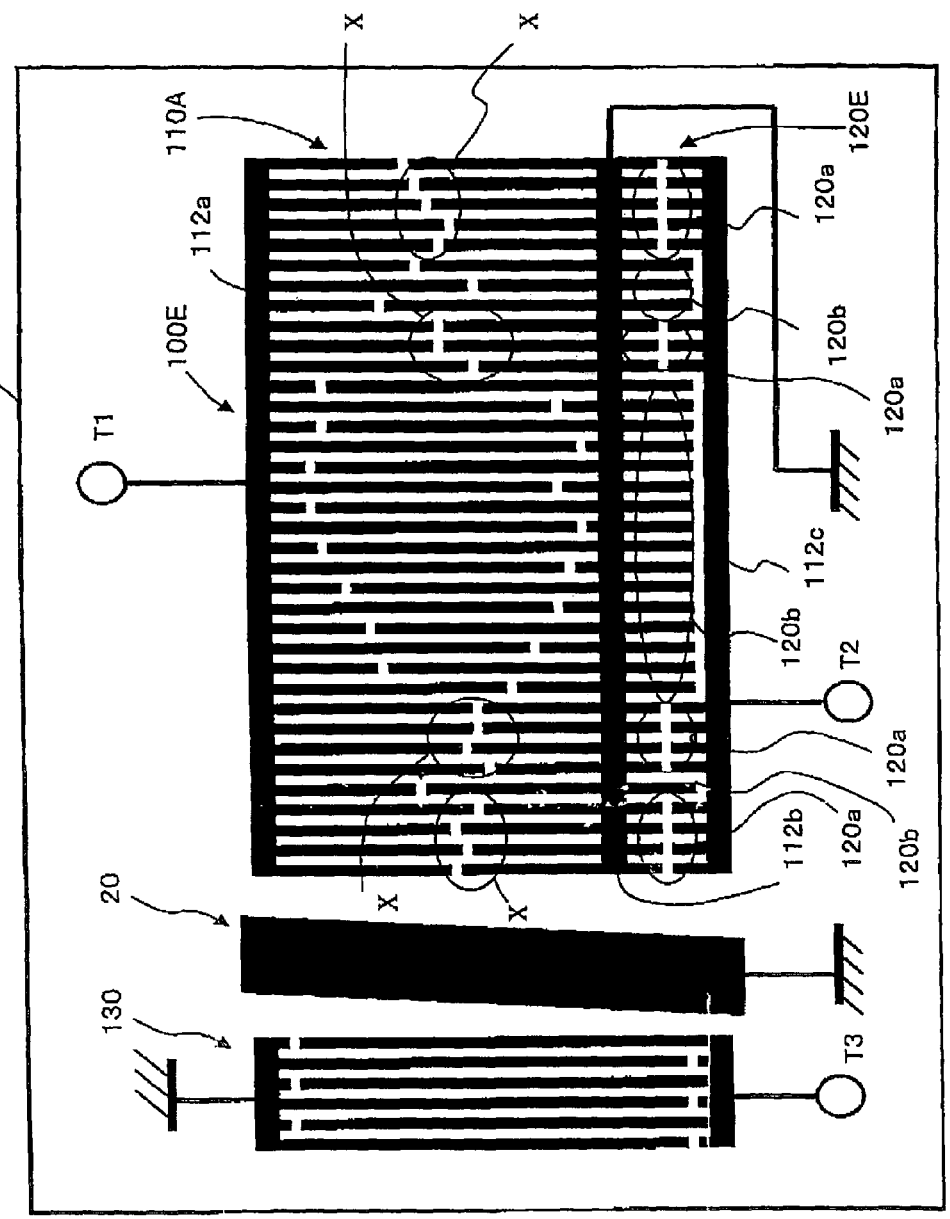
FIG. 10 illustrates a filter in accordance with a fourth embodiment of the present invention.

FIG. 10 illustrates a filter in accordance with a fourth embodiment of the present invention. In FIG. 10, the same components as those of the foregoing embodiments are denoted by the same reference numerals as those of the foregoing embodiments. An apodized IDT 100E of this filter has a sub electrode finger pattern 120E that is formed on one side of the main electrode finger pattern 110A and corresponds to the entire main electrode finger pattern 110A. The sub electrode finger pattern 120E includes parts 120a that have the same electrode finger patterns as the electrode finger pattern shown in FIG. 6, and parts 120b that hold dummy electrode fingers. Hereinafter, the parts 120a will be referred to as the leakage electric field wave canceling parts 120a, and the parts 120b will be referred to as the dummy pattern parts 120b. The leakage electric field wave canceling parts 120a correspond to minute electrode finger overlapping parts X contained in the main electrode finger pattern 110A. The minute electrode finger overlapping parts X have aperture lengths of $\lambda/4$ or smaller, for example. As described earlier with reference to FIG. 2, the influence of the leakage electric fields cannot be ignored when the aperture length is $\lambda/4$ smaller. Therefore, the leakage electric field wave canceling parts 120a are formed to correspond to the minute electrode finger overlapping parts X (i.e., the parts 120a are formed in the positions representing the same time-domain response as the minute electrode finger overlapping parts X). The minute electrode finger overlapping parts X are formed not only on both ends of the main electrode finger pattern 110A but also in inner areas of the main electrode finger pattern 110A. Therefore, the leakage electric field wave canceling parts 120a are formed in accordance with the arrangement of the minute electrode finger overlapping parts X. Each of the leakage electric field wave canceling parts 120a is an electrode finger pattern including an excitation point. The dummy pattern parts 120b are formed to correspond to the other parts than the minute electrode finger overlapping parts X of the main electrode finger pattern 110A. The other parts than the minute electrode finger overlapping parts X have aperture lengths of $\lambda/4$ or greater. The dummy pattern parts 120b are provided to form the same surface acoustic wave propagation state as in the main electrode finger pattern 110A. Each of the electrode fingers in the dummy pattern parts 120b extend from the bus bar 112b of the ground potential to the bus bar 112c. Accordingly, the dummy pattern parts 120b do not have an excitation point.

In this manner, the leakage electric field wave canceling parts 120a (i.e., the excitation points) that generate the opposite-phase electric fields are formed in areas that are affected by leakage electric fields generated in the sub electrode finger pattern 120E, so that the opposite-phase electric fields cancel the leakage electric fields generated in the main electrode finger pattern 110A. With this structure, the stop-band suppression can be increased.

Fifth Embodiment

Figure 11:
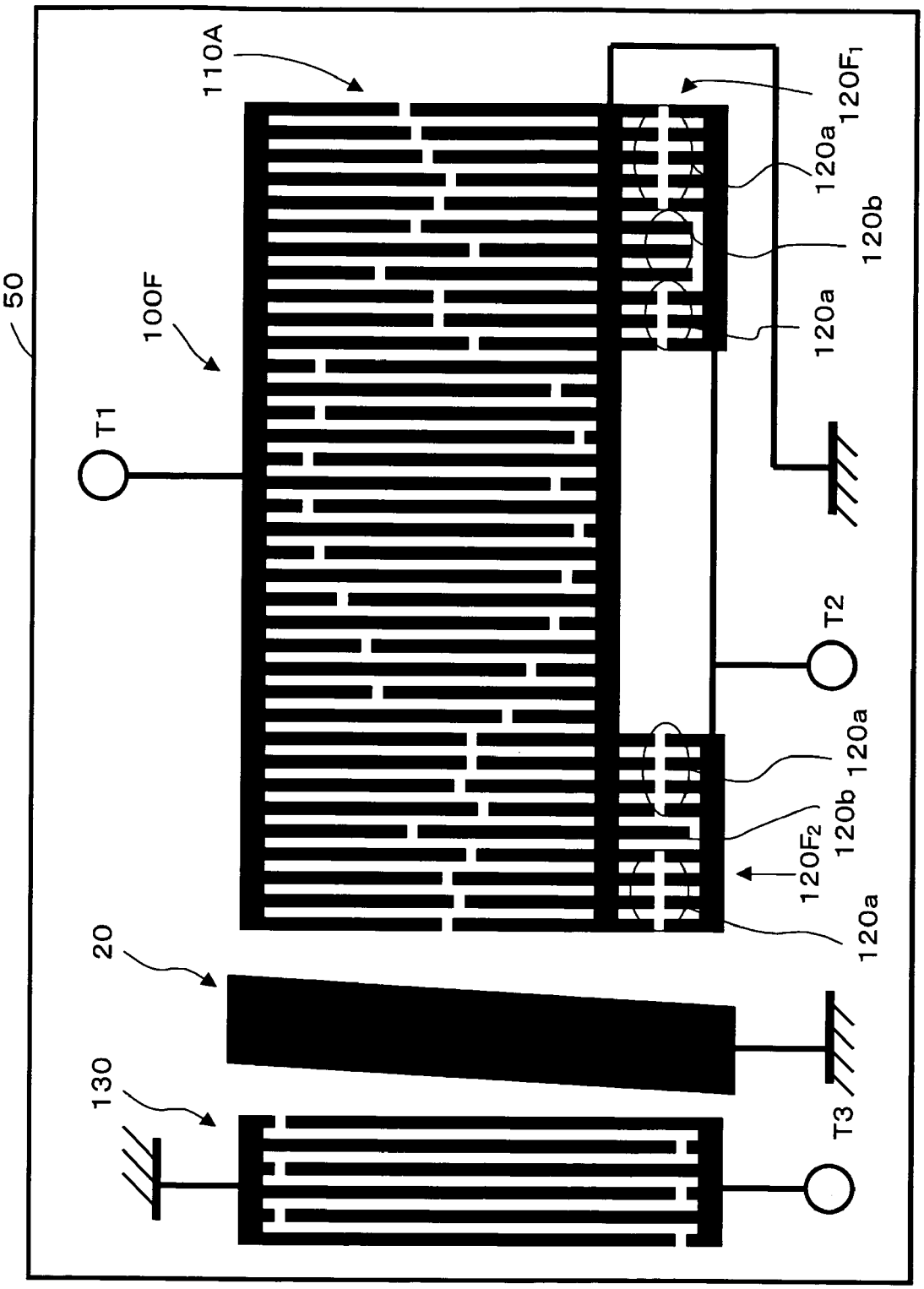
FIG. 11 illustrates a filter in accordance with a fifth embodiment of the present invention.

FIG. 11 illustrates a filter in accordance with a fifth embodiment of the present invention. In FIG. 11, the same components as those of the foregoing embodiments are denoted by the same reference numerals as those of the foregoing embodiments. The structure shown in FIG. 11 is a modification of the structure shown in FIG. 10. An IDT 100F shown in FIG. 11 differs from the IDT 100E shown in FIG. 10 in that the dummy pattern part 120b in the center is removed from the sub electrode finger pattern 120E. As a result, the IDT 100F has sub electrode finger patterns $120F_1$ and $120F_2$ that are formed on one side of the main electrode finger pattern 110A and correspond to both end regions of the main electrode finger pattern 110A. Each of the sub electrode finger patterns $120F_1$ and $120F_2$ includes leakage electric field wave canceling parts 120a and a dummy pattern part 120b. Depending on the structure of the main electrode finger pattern 110A, the sub electrode finger patterns $120F_1$ and/or $120F_2$ may not include a dummy pattern part.

In this manner, the leakage electric field wave canceling parts 120a (i.e., the excitation points) that generate the opposite-phase electric fields are formed in the areas that are affected by the leakage electric fields generated in the sub electrode finger patterns $120F_1$ and $120F_2$, so that the opposite-phase electric fields cancel the leakage electric fields generated in the main electrode finger pattern 110A. With this structure, the stop-band suppression can be increased.

Sixth Embodiment

The above described sub electrode finger patterns 120A through 120E, $120F_1$, and $120F_2$ each have the electrode finger pattern with the aperture lengths of zero as shown in FIG. 6, so as to cancel the leakage electric fields generated in the main electrode finger pattern 110A. However, the sub electrode finger patterns 120A through 120E, $120F_1$, and $120F_2$ are not limited to the electrode finger pattern shown in FIG. 6, and may be sub electrode finger patterns including minute electrode finger overlapping parts as shown in FIG. 4. In the following, a sub electrode finger pattern including minute electrode finger overlapping parts is described, with reference to FIG. 12.

Figure 12:
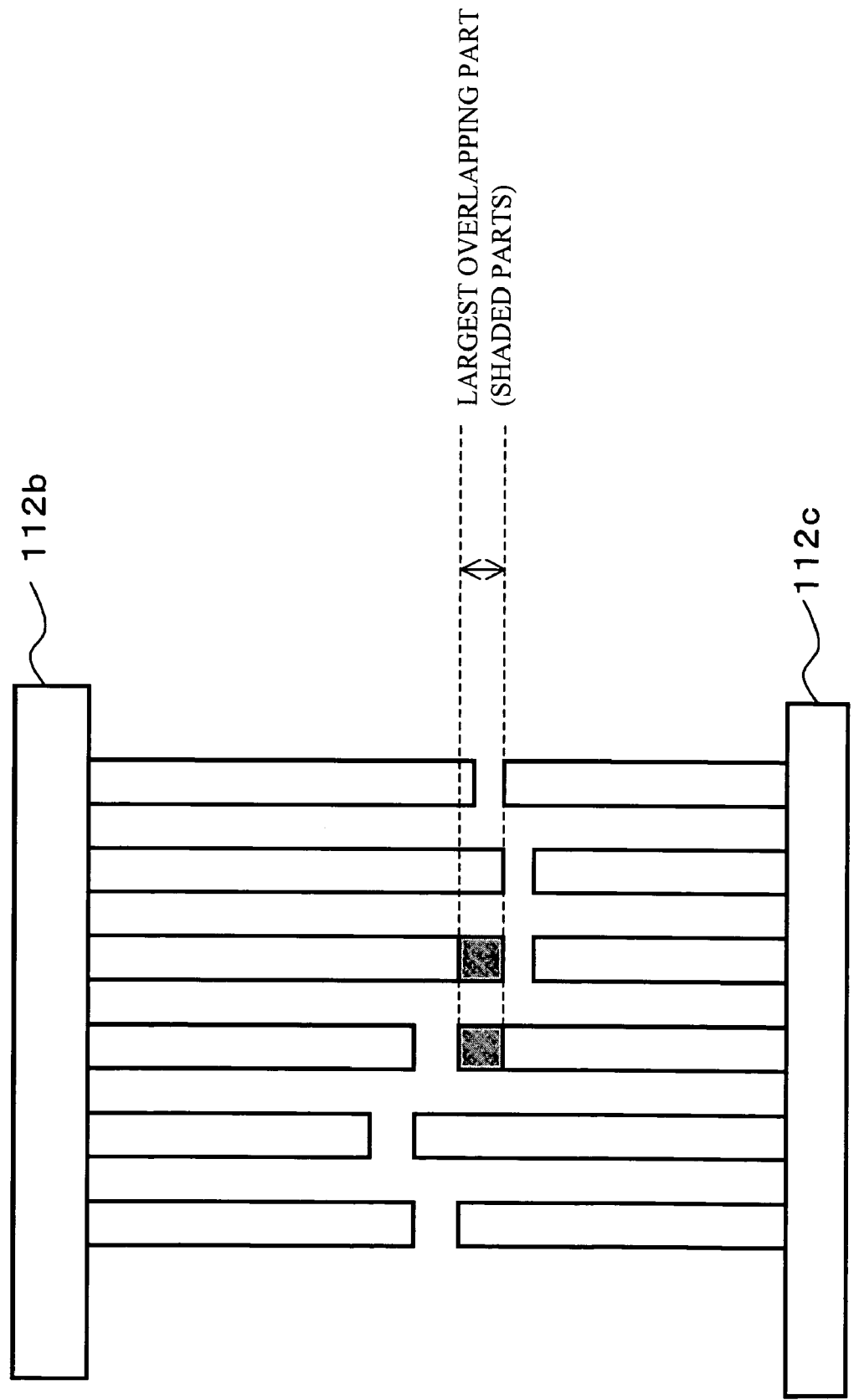
FIG. 12 illustrates another example of the sub electrode finger pattern.

FIG. 12 illustrates the sub electrode finger pattern including the minute electrode finger overlapping parts. The minute aperture lengths may be uniform or differ from one another. In either case, the largest aperture length in the sub electrode finger pattern should preferably be equal to or smaller than the smallest aperture length, the smallest electrode finger interval (the distance between each two neighboring electrode fingers), or the smallest gap (the distance between each two electrode finger ends facing each other) in the main electrode finger pattern. Here, the largest aperture length in the sub electrode finger pattern can be made equal to or smaller than the smallest value of the smallest aperture length, the smallest electrode finger interval, and the smallest gap in the main electrode finger pattern.

Figure 13:
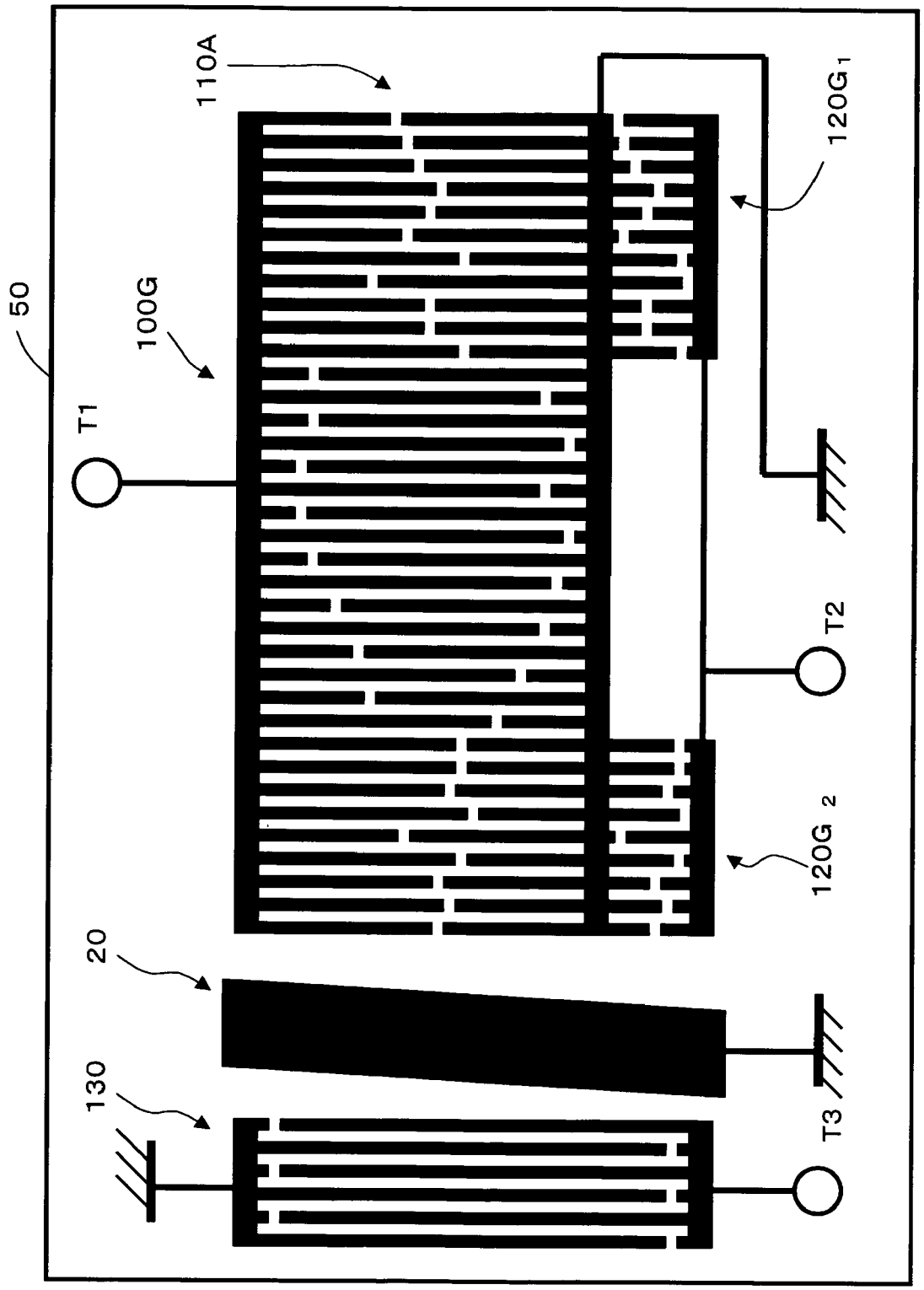
FIG. 13 illustrates a filter in accordance with a sixth embodiment of the present invention.

Other than the above structure, the following sub electrode finger patterns with minute electrode finger overlapping parts can be employed. The sub electrode finger patterns 120A through 120E, $120F_1$, and $120F_2$ may have electrode finger overlapping parts having the same widths as the minute electrode finger overlapping parts of the main electrode finger pattern 110A each having a width of $\lambda/4$ or smaller. FIG. 13 illustrates a filter as a sixth embodiment that has such sub electrode finger patterns in place of the sub electrode finger patterns 120F$_1$ and 120F$_2$ shown in FIG. 11.

An apodized IDT 100G of the filter shown in FIG. 13 includes two sub electrode finger patterns 120G$_1$ and 120G$_2$. The two sub electrode finger patterns 120G$_1$ and 120G$_2$ are provided on one side of the main electrode finger pattern 110A. The two sub electrode finger patterns 120G$_1$ and 120G$_2$ have electrode finger overlapping parts in the positions corresponding to the minute electrode finger overlapping parts of the main electrode finger pattern 110A each having a width of λ/4 or smaller, and each of the aperture lengths of the sub electrode finger patterns 120G$_1$ and 120G$_2$ is equal to the width of each corresponding electrode finger overlapping part of the main electrode finger pattern 110A.

In this manner, the excitation points that generate the opposite-phase electric fields are provided in the areas that are affected by the leakage electric fields generated in the sub electrode finger patterns 120G$_1$ and 120G$_2$, so that the opposite-phase electric fields cancel the leakage electric fields generated in the main electrode finger pattern 110A. With this structure, the stop-band suppression can be increased Each of the sub electrode finger patterns 120A through 120E, 120F$_1$, and 120F$_2$ may have both of the patterns shown in FIGS. 6 and 12, or may have dummy patterns for the electrode finger overlapping parts each having a width of λ/4 or greater as in the fourth embodiment.

Seventh Embodiment

Figure 14:
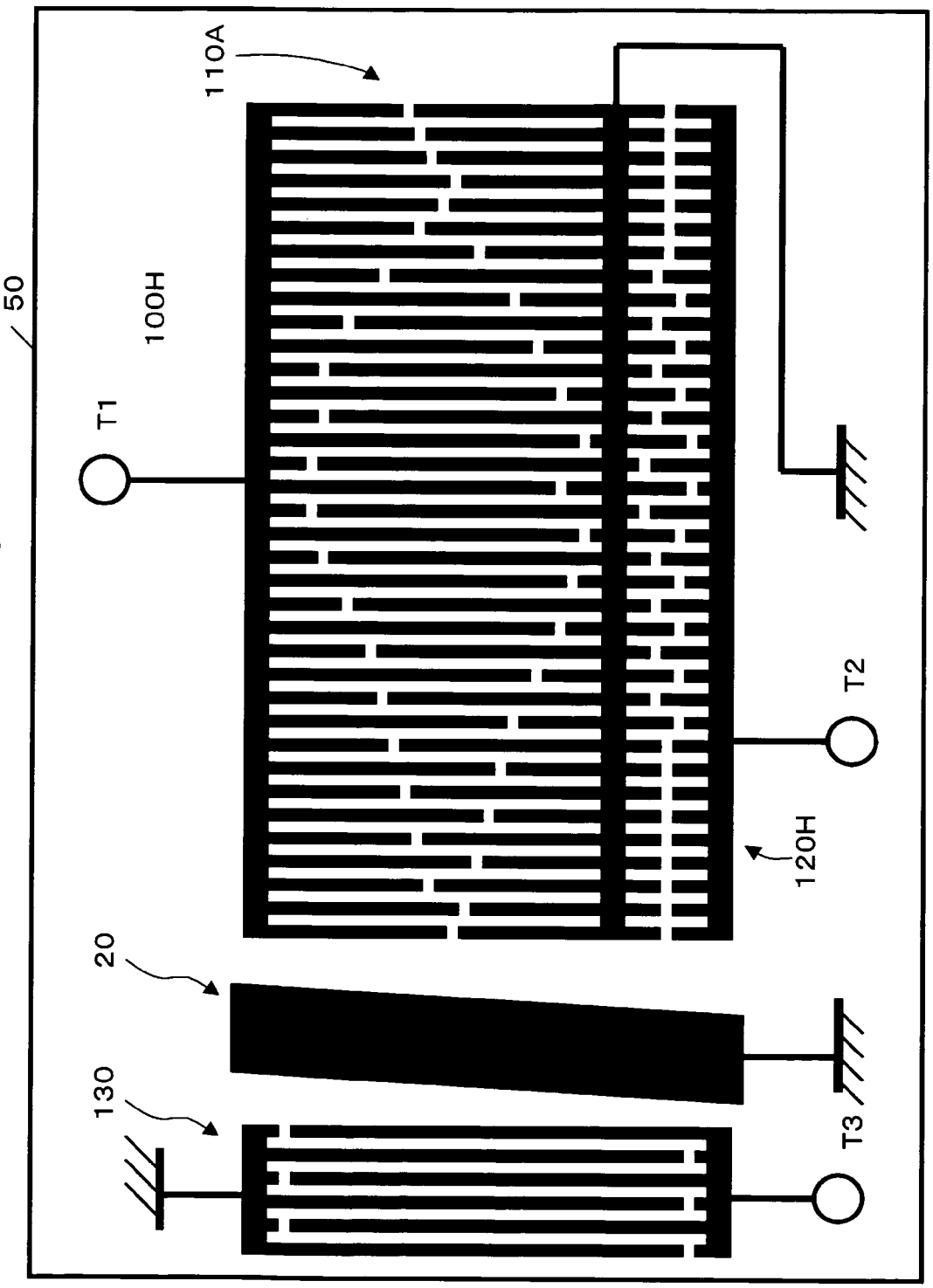
FIG. 14 illustrates a filter in accordance with a seventh embodiment of the present invention.

FIG. 14 illustrates a filter in accordance with a seventh embodiment of the present invention. In FIG. 14, the same components as those of the foregoing embodiments are denoted by the same reference numerals as those of the foregoing embodiments. An IDT 100H of this filter has a sub electrode finger pattern 120H that is formed along one side of the main electrode finger pattern 110A. The sub electrode finger pattern 120H has an apodized structure that is similar to the apodized structure of the main electrode finger pattern 110A but is smaller than the apodized structure of the main electrode finger pattern 110A. Although the end portions of the sub electrode finger pattern 120H in the surface acoustic wave propagation direction are shown in the same manner as in FIG. 6 for convenience, each of the end portions of the sub electrode finger pattern 120H has a structure similar to and smaller than the corresponding minute electrode finger overlapping parts of the main electrode finger pattern 110A. Being smaller than the main electrode finger pattern 110A, the sub electrode finger pattern 120H has a smaller aperture length than that of the main electrode finger pattern 110A. The aperture length of the sub electrode finger pattern 120H may be smaller than the aperture length of the main electrode finger pattern 110A, even if the sub electrode finger pattern 120H does not have the above-described similar and reduced structure.

In this manner, the sub electrode finger pattern 120H having a structure that is similar to and smaller than the main electrode finger pattern 110A is used so as to cancel the leakage electric fields generated in the main electrode finger pattern 110A. Thus, the stop-band suppression can be increased.

Eighth Embodiment

Figure 15:
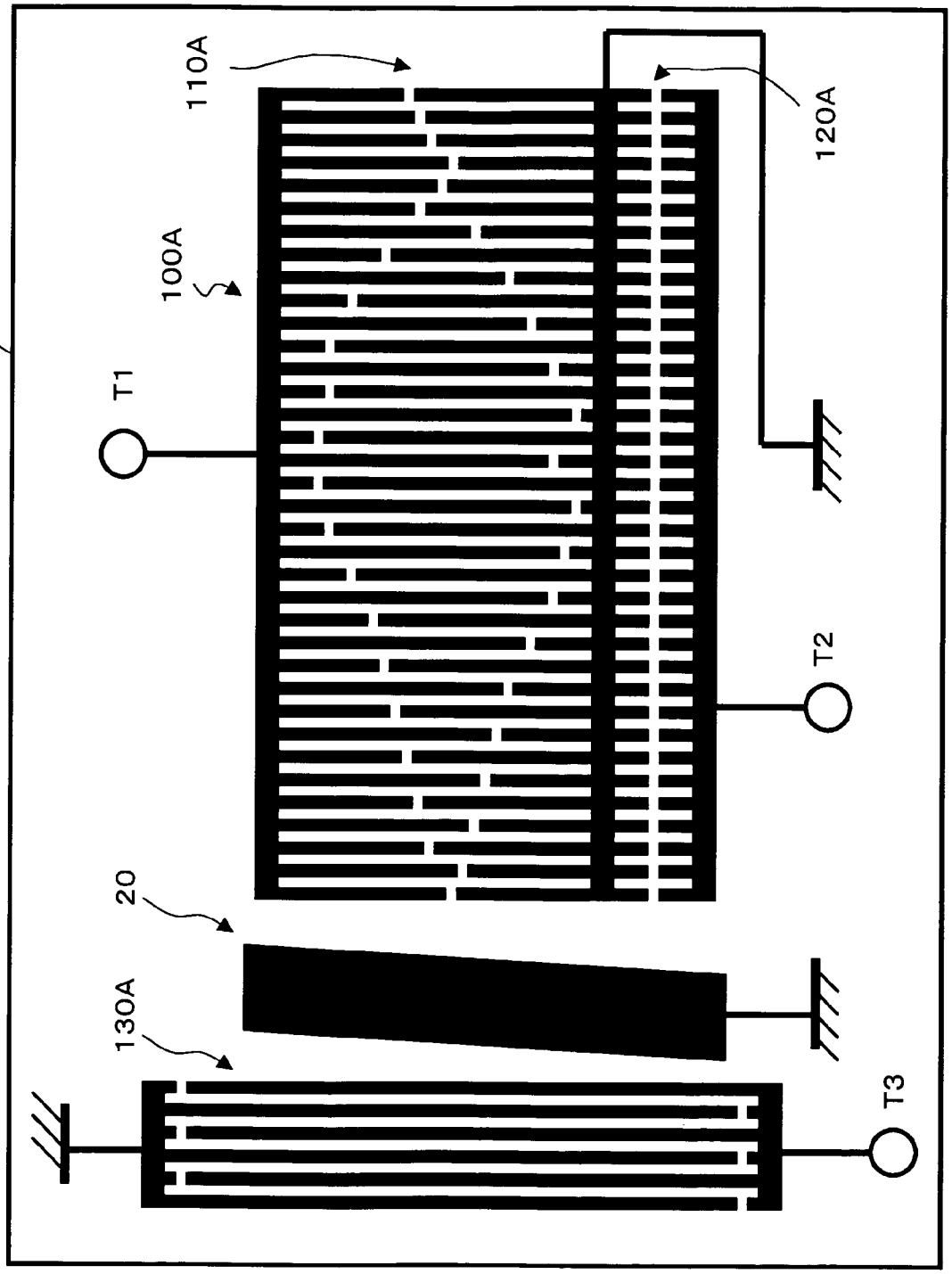
FIG. 15 illustrates a filter in accordance with an eighth embodiment of the present invention.

FIG. 15 illustrates a filter in accordance with an eighth embodiment of the present invention. In FIG. 15, the same components as those of the foregoing embodiments are denoted by the same reference numerals as those of the foregoing embodiments. This filter is a modification of the filter shown in FIG. 5. This filter has an IDT 130A with a different structure from the IDT 130 of any of the foregoing embodiments. The IDT 130A that is not apodized has an aperture length that is greater than the total width (the total length in the direction perpendicular to the surface acoustic wave propagation direction) of the main electrode finger pattern 110A and the sub electrode finger pattern 120A. When an AC voltage is applied to the terminals T1 and T2 in this structure, the surface acoustic waves generated from the main electrode finger pattern 110A and the sub electrode finger pattern 120A can be received without fail.

The IDT 130A may be implemented not only in the first embodiment but also in any of the second through seventh embodiments.

Ninth Embodiment

Figure 16:
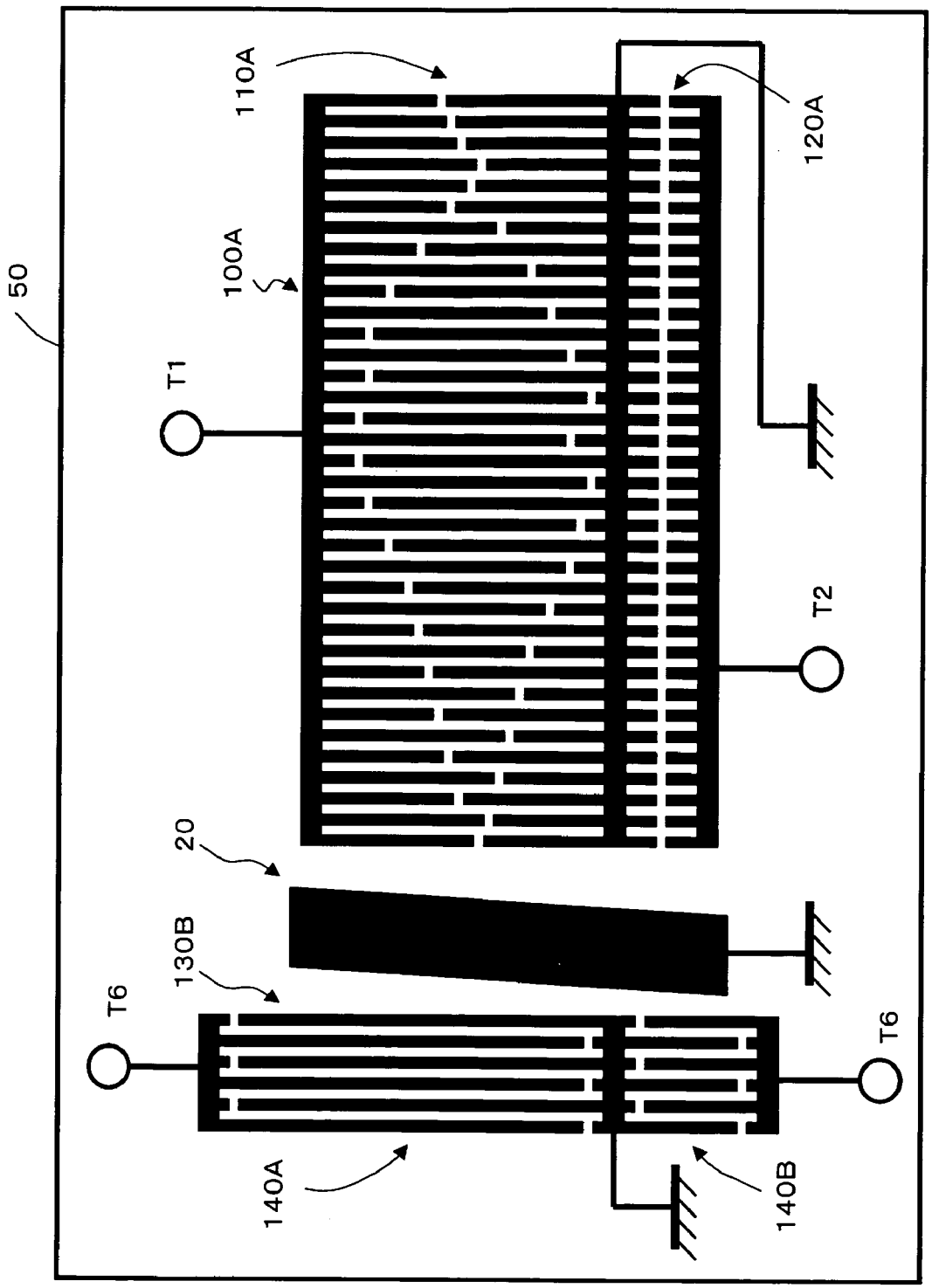
FIG. 16 illustrates a filter in accordance with a ninth embodiment of the present invention.

FIG. 16 illustrates a filter in accordance with a ninth embodiment of the present invention. In FIG. 16, the same components as those of the foregoing embodiments are denoted by the same reference numerals as those of the foregoing embodiments. This filter has an IDT 130B with a different structure of either of the IDTs 130 and 130A. The IDT 130B includes two electrode finger patterns 140A and 140B. The electrode finger pattern 140A corresponds to the main electrode finger pattern 110A of the IDT 100A, and the electrode finger pattern 140B corresponds to the sub electrode finger pattern 120A of the IDT 100A. The aperture length of the electrode finger pattern 140A is equal to or greater than the aperture length of the main electrode finger pattern 110A. Likewise, the aperture length of the electrode finger pattern 140B is equal to or greater than the aperture length of the sub electrode finger pattern 120A. With this structure, the surface acoustic wave generated from the IDT 100A when an AC voltage is applied to the terminals T1 and T2 can be received by the IDT 130B without fail.

The IDT 130B may be implemented not only in the first embodiment, but also in any of the second through seventh embodiments.

Each of the IDTs 130 and 130A of the foregoing embodiments can be considered to be shared between the main electrode finger pattern 110A and the sub electrode finger pattern 120A of the IDT 100A.

Tenth Embodiment

Figure 17:
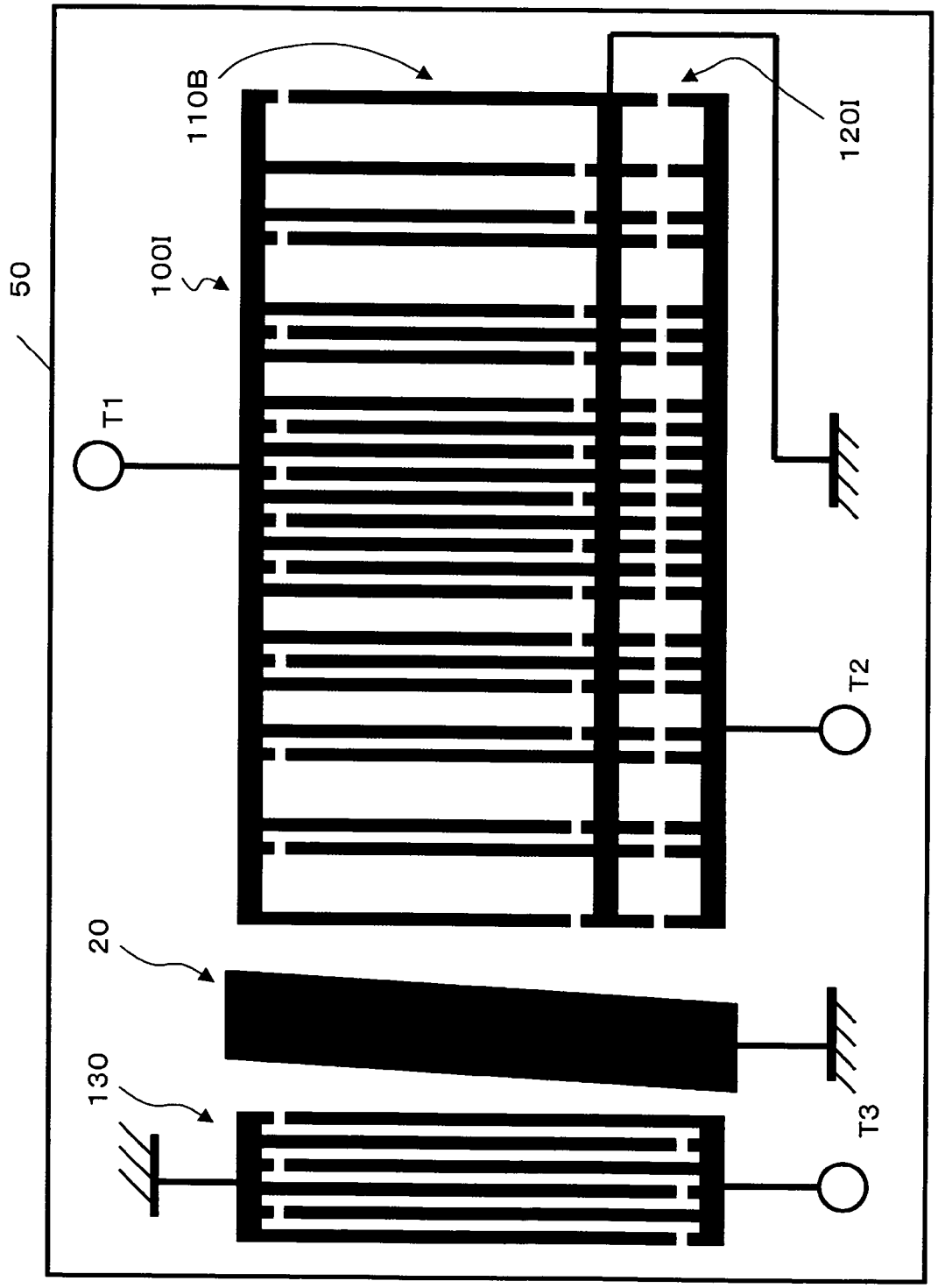
FIG. 17 illustrates a filter in accordance with a tenth embodiment of the present invention.

FIG. 17 illustrates a filter in accordance with a tenth embodiment of the present invention. In FIG. 17, the same components as those of the foregoing embodiments are denoted by the same reference numerals as those of the foregoing embodiments. A main electrode finger pattern 110B of an IDT 100I of this filter has a structure that is not apodized but is weighted by withdrawing the electrode fingers (a withdrawn-electrode structure). A sub electrode finger pattern 120I of the IDT 100I has an electrode finger pattern in accordance with the weighting of the main electrode finger pattern 110B. In the positions representing the same time-domain response, the main electrode finger pattern 110B generates a leakage electric field wave, and the sub electrode finger pattern 120I generates an electric field wave of the opposite phase to the leakage electric field wave generated by the main electrode finger pattern 110B. The sub electrode finger pattern 120I shown in FIG. 17 has the structure shown in FIG. 6, but may have the structure with minute electrode finger overlapping parts shown in FIG. 12.

The weighting shown in FIG. 17 may be applied to any of the first through ninth embodiments. Also, any other suitable weighting may be applied to each of the embodiments.

Figure 18:
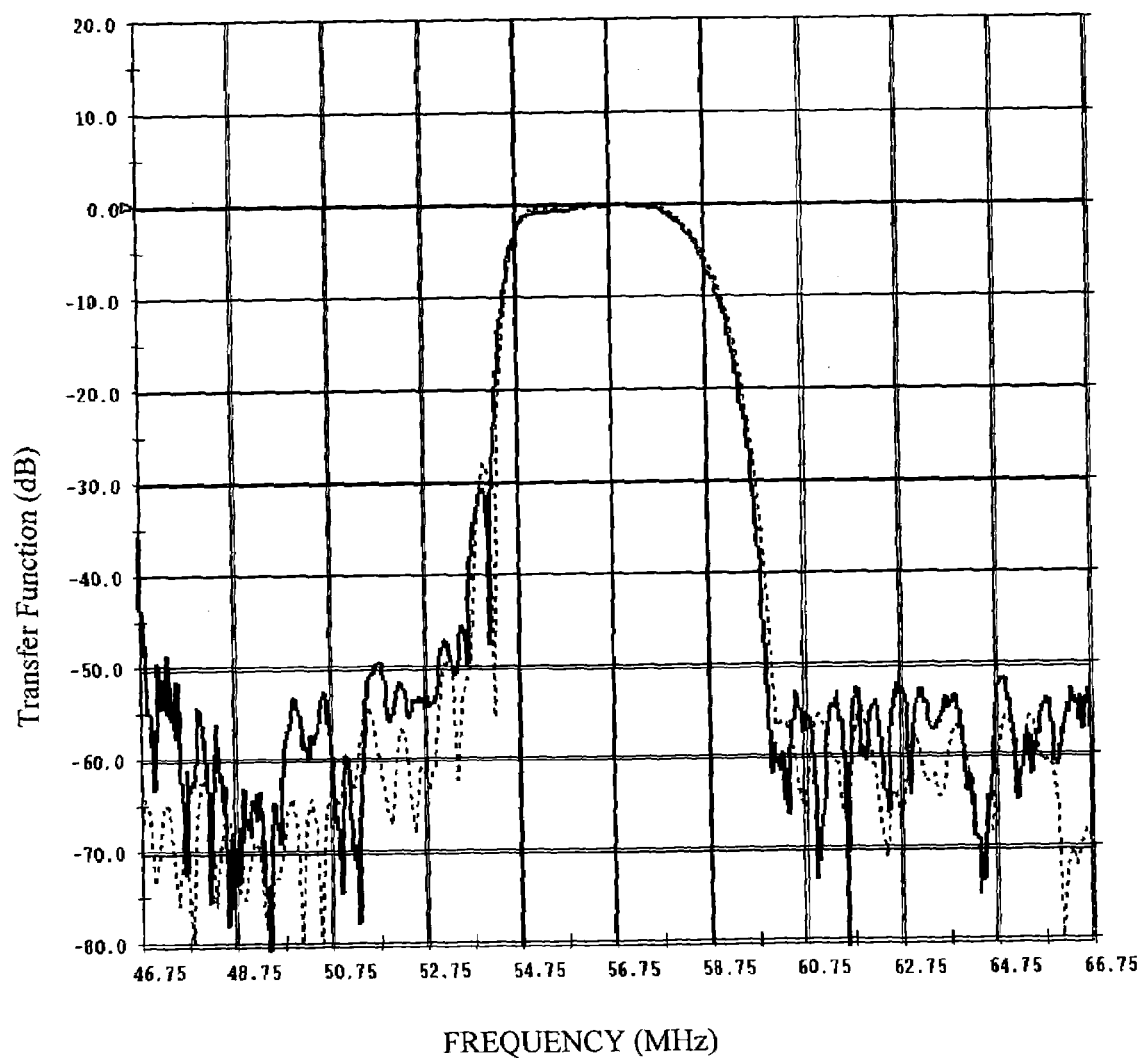
FIG. 18 is a graph representative of the frequency characteristics of the filter shown in FIG. 1 and the filter shown in FIG. 5.

FIG. 18 is a graph representative of the frequency characteristics of the conventional filter shown in FIG. 1 and the filter of the present invention shown in FIG. 5. In FIG. 18, the abscissa axis indicates frequency (MHz), and the ordinate axis indicates attenuation (dB). In the graph, the solid line represents the characteristics of the conventional filter, and the broken line represents the characteristics of the filter of the present invention. These filters are made of 112 LiTaO$_3$. The aperture lengths of the sub electrode finger pattern 120A of the filter of the present invention are zero. As can be seen from the graph, the leakage electric fields generated in the main electrode finger pattern is canceled by the sub electrode finger pattern, and the stop-band suppression (the stop-band attenuation) is increased.

As described so far, in accordance with the present invention, leakage electric fields can be canceled, and the stop-band suppression of a filter can be increased accordingly.

Although solid electrodes are employed in each of the above described embodiments, unidirectional electrodes (SPUDT) such as split electrodes and DART electrodes ($\lambda/8$–$3\lambda/8$ electrodes) can be employed to achieve the same effects as the present invention. The piezoelectric substrate is not limited to the above described example, and any suitable type of substrate can be effectively employed.

With the increased stop-band suppression, any filter in accordance with the present invention can be employed as the RF filter in a portable telephone device or the intermediate frequency filter in a TV tuner, so as to improve the frequency characteristics of the portable telephone device or the TV tuner. Especially, a filter in accordance with the present invention can achieve high attenuation in the stop bands, which is strongly needed in digital terrestrial broadcasting.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A filter comprising:
a piezoelectric substrate; and
a plurality of interdigital transducers (IDTs) formed on the piezoelectric substrate, at least one of the IDTs having a main electrode finger pattern that is weighted, and
the at least one of the IDTs also having a sub electrode finger pattern that is connected in parallel to the main electrode finger pattern, and generates a surface acoustic wave that cancels a surface acoustic wave caused by leakage electric fields generated in the main electrode finger pattern,
another one of the IDTs being located in a propagation direction in which a surface acoustic wave generated by the main electrode finger pattern of the at least one of the IDTs is propagated,
a first aperture length of the another one of the IDTs being arranged so as to overlap, in the propagation direction, with a second aperture length of the main electrode finger pattern of the at least one of the IDTs and a third aperture length of the sub electrode finger pattern of the at least one of the IDTs,
the second and third aperture lengths extending in a direction perpendicular to the propagation direction.

2. The filter as claimed in claim 1, wherein the sub electrode finger pattern has a structure that generates a surface acoustic wave of the opposite phase to the surface acoustic wave caused by the leakage electric fields generated in the main electrode finger pattern, the surface acoustic wave in the sub electrode finger pattern and the surface acoustic wave in the main electrode finger pattern being generated in positions representing the same time-domain response.

3. The filter as claimed in claim 1, wherein the sub electrode finger pattern is formed to correspond to the entire main electrode finger pattern.

4. The filter as claimed in claim 1, wherein the sub electrode finger pattern is provided for at least one of electrode finger gaps from which the surface acoustic wave caused by the leakage electric fields in the main electrode finger pattern is generated.

5. The filter as claimed in claim 1, wherein the sub electrode finger pattern is provided for regions having aperture lengths of $\lambda/4$ or smaller in the main electrode finger pattern, where $\lambda$ is the wavelength of the surface acoustic wave propagating on the piezoelectric substrate.

6. The filter as claimed in claim 1, wherein the sub electrode finger pattern includes:
excitation points that are provided for regions having aperture lengths of $\lambda/4$ or smaller in the main electrode finger pattern, where $\lambda$ is the wavelength of the surface acoustic wave propagating on the piezoelectric substrate; and
ground potential electrode fingers that are provided for the other regions in the main electrode finger pattern.

7. The filter as claimed in claim 1, wherein the sub electrode finger pattern includes a pattern that is similar to and smaller than the main electrode finger pattern.

8. The filter as claimed in claim 1, wherein the sub electrode finger pattern includes:
excitation points that are provided for regions having aperture lengths of $\lambda/4$ or smaller in the main electrode finger pattern, where $\lambda$ is the wavelength of the surface acoustic wave propagating on the piezoelectric substrate; and
ground potential electrode fingers that are provided for the other regions in the main electrode finger pattern,
the excitation points being formed with a pattern that is similar to and smaller than the pattern forming the regions having the aperture lengths of $\lambda/4$ of smaller.

9. The filter as claimed in claim 1, wherein the sub electrode finger pattern has electrode fingers, all of which have overlapping aperture lengths of zero.

10. The filter as claimed in claim 1, wherein:
the sub electrode finger pattern has electrode fingers overlapping with one another; and
the largest aperture length is equal to or smaller than the smallest value of the smallest aperture length, the smallest electrode finger interval, and the smallest gap in the main electrode finger pattern.

11. The filter as claimed in claim 1, wherein the sub electrode finger pattern includes electrode finger overlapping parts that are provided for regions having aperture lengths of $\lambda/4$ or smaller in the main electrode finger pattern, $\lambda$ being the wavelength of the surface acoustic wave propagating on the piezoelectric substrate, and have the same aperture lengths as the aperture lengths of the electrode finger overlapping parts in each of the regions.

12. The filter as claimed in claim 1, wherein the sub electrode finger pattern includes an excitation point that is located on a straight line extending from an excitation point of the main electrode finger pattern in a direction perpendicular to the surface acoustic wave propagation direction.

13. The filter as claimed in claim 1, wherein:
the plurality of IDTs include an IDT that has a non-weighted electrode finger pattern; and the non-weighted electrode finger pattern of the IDT is shared between the main electrode finger pattern and the sub electrode finger pattern, and has an aperture length that is equal to or greater than the aperture length of the main electrode finger pattern.

14. The filter as claimed in claim 1, wherein:

the plurality of IDTs include an IDT that has a non-weighted electrode finger pattern;

the IDT has first and second electrode finger patterns corresponding to the main electrode finger pattern and the sub electrode finger pattern, respectively; and the first electrode finger pattern has an aperture length that is equal to or greater than the aperture length of the main electrode finger pattern, while the second electrode finger pattern has an aperture length that is equal to or greater than the aperture length of the sub electrode finger pattern.

15. The filter as claimed in claim 1, wherein the sub electrode finger pattern has a pair of bus bars; and the distance between the bus bars is shorter than the distance between a pair of bus bars of the main electrode finger pattern.

16. The filter as claimed in claim 1, wherein the main electrode finger pattern is weighted by apodization.

17. The filter as claimed in claim 1, wherein the main electrode finger pattern is weighted by withdrawing electrode fingers.

* * * * *